United States Patent [19]

Hawkins

[11] Patent Number: 4,863,560
[45] Date of Patent: Sep. 5, 1989

[54] FABRICATION OF SILICON STRUCTURES BY SINGLE SIDE, MULTIPLE STEP ETCHING PROCESS

[76] Inventor: William G. Hawkins, 175 Stony Point Trail, Webster, N.Y. 14580

[21] Appl. No.: 234,994

[22] Filed: Aug. 22, 1988

[51] Int. Cl.⁴ ............... H01L 21/306; R44C 1/22; C03C 15/00; C03C 25/06
[52] U.S. Cl. ............... 156/644; 156/633; 156/647; 156/651; 156/653; 156/657; 156/661.1; 156/662; 346/140 R
[58] Field of Search ............... 156/633, 644–651, 156/653, 657, 659.1, 661.1, 662; 346/1.1, 140 R, 140 A; 430/310, 312, 313, 316, 317

[56] References Cited

U.S. PATENT DOCUMENTS

| | | | |
|---|---|---|---|
| RE. 32,572 | 1/1988 | Hawkins et al. | 156/626 |
| 4,612,554 | 9/1986 | Poleshuk | 346/140 R |
| 4,638,337 | 1/1987 | Torpey et al. | 346/140 R |
| 4,639,748 | 1/1987 | Drake et al. | 346/140 R |

*Primary Examiner*—William A. Powell
*Attorney, Agent, or Firm*—Victor F. Volk

[57] ABSTRACT

Three dimensional silicon structures are fabricated from (100) silicon wafers by a single side, multiple step ODE etching process. All etching masks are formed one on top of the other prior to the initiation of etching, with the coarsest mask formed last and used first. Once the coarse anisotropic etching is completed, the coarse mask is removed and the finer anisotropic etching is done. The preferred embodiment is described using a thermal ink jet channel plate as the three dimensional structure, where coarse etching step provides the reservoir and the fine etching step provides the ink channels.

7 Claims, 4 Drawing Sheets

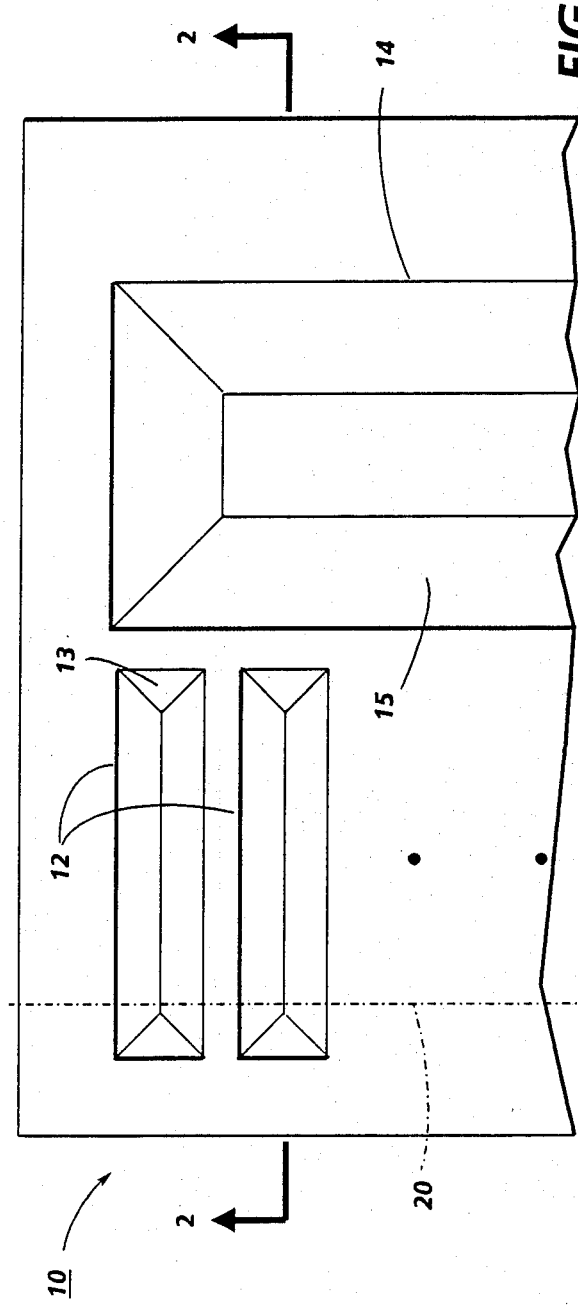
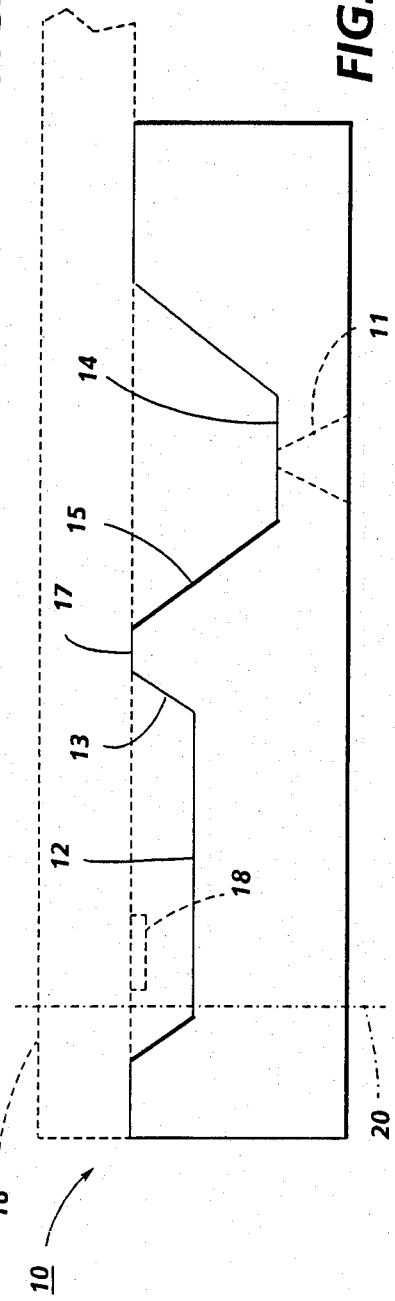
FIG. 1 PRIOR ART
FIG. 2 PRIOR ART

FABRICATION OF SILICON STRUCTURES BY SINGLE SIDE, MULTIPLE STEP ETCHING PROCESS

BACKGROUND OF THE INVENTION

1. Field of the Invention

This invention relates to a single side, multiple step orientation dependent etching process for the fabrication of three dimensional structures from silicon, and more particularly to the use of this process for the mass production of ink jet printheads.

2. Description of the Prior Art

A fundamental physical limitation of orientation etching (ODE) in silicon is that {111} crystal planes etch very slowly, while all other crystal planes etch rapidly. Consequently, only rectangles and squares can be generated in (100) silicon material or wafers with a high degree of precision. Even with rectangles and squares, the dimensional precision of the etched recesses or holes require that the edges of the mask defining the rectangles or squares be aligned with the intersection of the {111} and {100} crystal planes. In the semiconductor industry, it is frequently desirable to generate large recesses or holes in association with relatively shallow recesses, which may or may not interconnect. For example, an ink jet printhead may be made of a silicon channel plate and a heater plant. Each channel plate has a relatively large ink manifold/reservoir recess or opening and a set of parallel, shallow, elongated channel recesses connecting to the reservoir at one end and open at the other end. When aligned and bonded with the heater plate, the recesses in the channel plate become the ink reservoir and the ink channels, as described more throughly in U.S. Pat. No. Re. 32,572 discussed below.

In such printheads, it is frequently desirable to generate a large reservoir, which is often etched completely through a 15 to 20 mil thick wafer, with small perpendicularly connecting channels which may be only 1 or 2 mils deep on the same silicon substrate. A major difficulty associated with fabrication of such a structure is that the channels and reservoir must be separately etched and then subsequently joined by a variety of methods, such as isotropic etching, dicing away the silicon material between the reservoir and channel, or use of a thick film layer on the heater plate that is patterned and etched to form ink flow bypasses. Generally, such a structure is formed by etching a plurality of reservoirs in a (100) silicon wafer first, and then accurately aligning the channels to the edge of the reservoir in a second lithography step, followed by etch mask delineation and a second short ODE step sufficient to etch the depth of the plurality of sets of associated channels. An advantage of such a process is that control of channel dimension would be very high because the mask defining the channels will be undercut about 1/10 as much as would be the case when the channel and reservoir are delineated simultaneously. This is because the {111} planes have a finite etch rate and the etch time for channels for the two cases is about a factor of 10 different. In fact, in order to etch through 20 mils of silicon in a short time, the etch is optimized for rapid etching and etch anisotropy suffers. If the shallow depth etch was done in a separate step, anisotropy could be increased from 1:100 to 1:400 or higher, depending on desired accuracy. The problem with such a two-step process is that it is difficult or impossible to do a second lithography step on an ODE etched wafer due to the large steps and/or etched through holes. The resist mask is very non-uniform and cannot be exposed for many reasons.

U.S. Pat. No. Re. 32,572 to Hawkins et al discloses a thermal ink jet printhead and method of fabrication. A plurality of printheads may be concurrently fabricated by forming a plurality of sets of heating elements with their individual addressing electrodes on one silicon wafer or other substrate and etching corresponding sets of grooves which may serve as ink channels with a common reservoir in another silicon wafer. The two wafers are aligned and bonded together, so that each channel has a heating element. The individual printheads are obtained by milling away the unwanted silicon material in the channel wafer to expose the addressing electrode terminals on the heating element wafer and then dicing the heating element wafer to obtain separate printheads.

U.S. Pat. No. 4,612,554 to Poleshuk discloses an ink jet printhead comprising two identical parts and a method for producing it. A plurality of V-shaped grooves are anisotropically etched on each part of the printhead between a linear array of heating elements. The grooves allow the parts to be mated in an automatically self-aligned manner.

U.S. Pat. No. 4,638,337 to Torpey et al discloses a two-part ink jet printhead comprising a channel plate and a heater plate. A thick film insulative layer is placed over the passivation layer for the circuitry on the heater plate and etched to open recesses therein above the heating elements and electrode terminals. This effectively places the heating elements in a pit, the walls of which inhibit bubble growth in the direction parallel with the direction of ink flow in the channels and promotes the bubbles growth in a direction normal to the heating elements. The net result is that "blow out" of the bubble is eliminated and the consequent ingestion of air prevented.

U.S. Pat. No. 4,639,748 to Drake et al discloses a two-part ink jet printhead comprising a channel plate and a heater plate. The manifold recess in the channel plate has an internal chamber recess provided by an enclosing wall inside of and surrounded by the manifold recess with the internal chamber wall having small passageways at its upper end, so that, when mated with the heater plate, ink is filtered when it flows from the internal chamber to the manifold through the small passageways because each of the small passageways have a flow area smaller than each of the nozzle flow areas. However, the total flow area of the small passageways is greater than the total flow area of the nozzles.

Application Ser. No. 082,417, filed Aug. 6, 1987, now U.S. Pat. No. 4,789,425, entitled "Thermal Ink Jet Printhead and Fabricating Process Therefor", to Drake et al, discloses a method for fabricating a roofshooter type thermal ink jet printhead comprising a channel or nozzle plate and a heater plate. The heater plate is silicon and is etched from the side opposite the one with the heat elements and addressing electrodes to form elongated openings through the heater plate which are precisely aligned with the heating elements. Once the passivation layer over and the insulative layer under the heating elements and addressing electrodes are removed from the bottom of the etched openings in the heater plates, the etched openings may serve as both ink inlets and reservoirs for the printhead.

Application Ser. No. 115,271, filed Nov. 2, 1987, now U.S. Pat. No. 4,774,530, entitled "An Improved Ink Jet Printhead", to Hawkins, discloses a two-part ink jet printhead comprising a channel plate and a heater plate. An elongated opening is formed in a thick film layer placed on the heater plate having sufficient size and location to provide an ink flow passageway between the manifold and the channels in the channel plate without requiring the removal of the channel closed ends which are adjacent the manifold by a dicing or etching operation.

Pending application Ser. No. 137,283, filed Dec. 23, 1987, entitled "Large Array Thermal Ink Jet Printhead", to Drake et al, discloses a large pagewidth array ink jet printhead comprising a heater plate and a channel plate. The channel plate is composed of a juxtaposed plurality of identical silicon sub-units, each having parallel opposite sides formed along the {111} crystal planes which permit accurate end-to-end assembly to produce the pagewidth channel plate.

Application Ser. No. 185,600, filed Apr. 25, 1988, now U.S. Pat. No. 4,822,755, entitled "Method of Fabricating Large Array Semiconductor Arrays", to Hawkins et al, discloses a method for separating integrated circuit chips formed on crystalline substrates. A plurality of vertical trenches are formed along predetermined intersecting lateral boundaries on the top surface of the substrate by a reactive ion etch process. The trenches are filled with an etchable material to produce a flat surface for forming the circuitry on the top surface of the substrate and passivating it. A plurality of grooves are etched on the back surface of the substrate in general alignment with the vertical trenches, the etching producing grooves which intersect the trenches and remove the etchable material. Thus, the combined action of the top and bottom etching steps separate the integrated circuits.

SUMMARY OF THE INVENTION

It is the object of this invention to enable a single side of a silicon wafer to have two or more successive ODE processes carried out without the need for additional intermediate lithographic steps and etch mask delineations for each subsequent ODE process.

It is another object of the invention to provide a method for forming three-dimensional structures which incorporate both large, coarse features and small, precise features through use of two-sequential ODE etches acting on (100) silicon, whereby all lithography is conducted prior to the first etch step.

In an embodiment of the present invention, a deep, through-wafer etch and associated shallow recess are both sequentially carried out on the same side of the wafer. Deep and shallow etches are usually required for ODE formation of thermal ink jet channel plates. In a channel plate example, a 5000 Å thick thermal oxide ($SiO_2$) is grown on a (100) silicon wafer. Lithography is performed to delineate an array of channels, a connected reservoir, and alignment marks on one side. The wafer is cleaned and a silicon nitride ($Si_3N_4$) layer of sufficient thicknes to assure robustness is deposited. The silicon nitride is delineated by a second lithographic process to form the reservoir via only, so that the edge of the silicon nitride completely borders on the exposed silicon created by the lithographic process of the thermal oxide layer. The wafer is ODE etched until the entire wafer is etched through to form the reservoir with the open bottom available as an ink inlet thereto.

Next, the silicon nitride is selectively stripped by any of several well known methods, and the wafer is further ODE etched to a depth necessary to form the channels. The thermal oxide layer can be left on or removed by a selective wet etch.

A similar process could be used for the case where alignment holes and other deep etched holes are desired in a silicon wafer. For example, use a double layer of $SiO_2/Si_3N_4$ and remove $SiO_2$ only over the alignment holes, ODE etch approximately 2 mils, etch off the rest of the $SiO_2$, then ODE etch the rest of the way through the wafer.

In an alternate embodiment, the surface of a silicon wafer is intentionally misoriented a precise number of degrees off the (100) plane in the (110) plane direction, so that the above single side, multi-step ODE processing technique produces trapezoidal shaped recesses.

The foregoing features and other objects will become apparent from a reading of the following specification in conjunction with the drawings, wherein like parts have the same index numerals.

BRIEF DESCRIPTION OF THE DRAWINGS

FIG. 1 is an enlarged, partially shown, plan view of a prior art ODE etched channel plate, showing a deep reservoir recess and its associated shallow elongated channel recesses.

FIG. 2 is a cross-sectional view of FIG. 1 as viewed along view line 2—2.

DESCRIPTION OF THE PREFERRED EMBODIMENT

Figure 3:
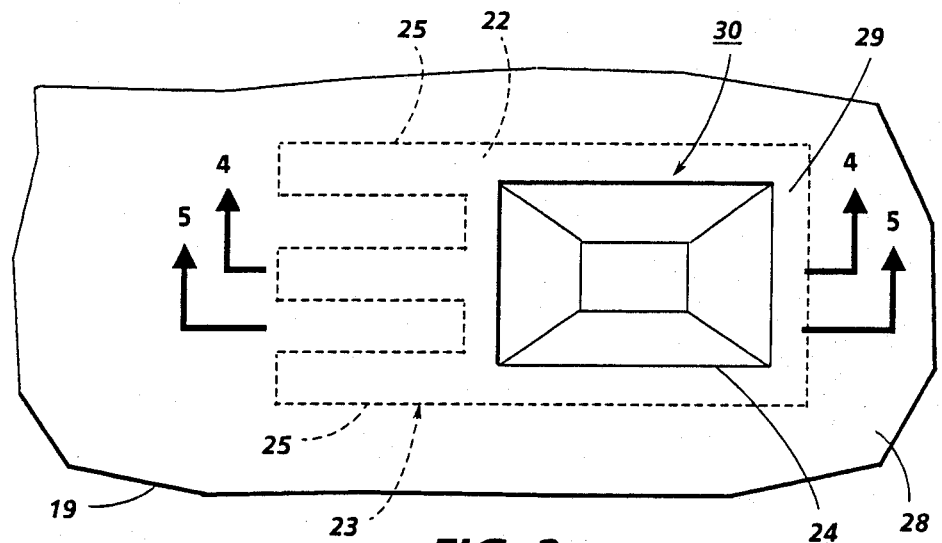
FIG. 3 is a partially shown, schematic plan view of a mask delineated wafer according to the present invention, the underlying $SiO_2$ patterned via being shown in dashed line.

From the above-mentioned references, it is known to produce a thermal ink jet printhead by aligning and bonding an ink directing channel plate to a heater plate. A typical prior art type silicon channel plate 10 is shown in FIG. 1 in a partially fabricated state and in an enlarged plan view. A plurality of parallel, elongated shallow recesses 12 and one relatively large deep recess 14 have been anisotropically or orientation dependently etched (ODE). The large recess could optionally have been etched entirely through the channel plate. In the configuration shown, an inlet means to recess 14 is yet to be provided. The inlet means may be produced by any well known means such as by etching techniques disclosed in the above references. Both the shallow recesses 12 and the large recess 14 have walls 13, 15 respectively, that lie along the {111}planes of the silicon channel plate.

FIG. 2 is a cross-sectional view of the partially constructed channel plate shown in FIG. 1 as viewed along view line 2—2 therein and mated with a heater plate 16 shown in dashed line. The silicon material 17 intermediate the shallow recesses 12 and large deep recess 14 may be removed by dicing or isotropic etch, as also disclosed in the above references, to provide communication between the shallow and deep recesses. A typically etched inlet 11 is shown in dashed line and a prior art printhead is readily recognized. Fabrication of the prior art printhead is complete with a dicing cut along dashed line 20 located a predetermined distance from heating element 18 also shown in dashed line.

The present invention is shown in FIG. 3, where a simplified schematical plan view of a portion of a silicon wafer surface 22, having two sequentially formed etch masks 23, 24 thereon, is depicted. Precise three dimensional structures in silicon having both shallow and deep recesses may be formed by sequential ODE processing. It is enabled by the use of two or more masks which are successively deposited and delineated on a single side of the silicon wafer. The top mask is for the deeper or coarser anisotropic etching. The first etching is followed by stripping of the outer mask and then a next anisotropic etching step is performed. The sequential etching is accomplished by conducting the deepest or coarsest etch first and proceeding successively from the coarsest to the finest etched features of the structure. After each etch, its mask is stripped exposing the next mask, followed by another anisotropic etch. Therefore, the need to create a lithographically delineated mask between etching processes is eliminated. The high tolerance fine or precise features are better preserved and protected by the coarser mask.

The preferred embodiment, described below, relates to a thermal ink jet printhead component, namely, the channel plate 21 (see FIG. 6). However, the application of this invention is much broader and relates to the fabrication of any three dimensional silicon structure (not shown) such as dimensionally true channel plate subunits suitable for abutting assembly to form a full pagewidth printhead or read-in scanner (RIS) arrays.

Figure 4:
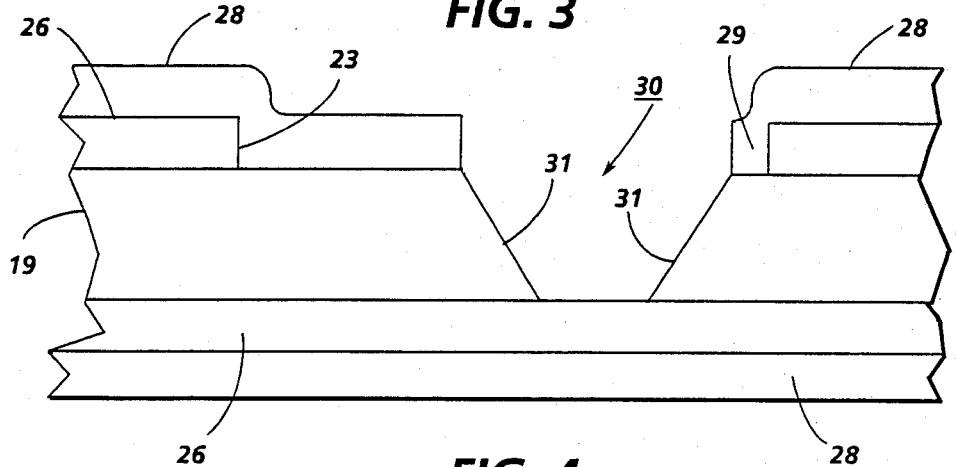
FIG. 4 is an enlarged, cross-sectional view of the wafer of FIG. 3, as viewed along view line 4—4.
Figure 5:
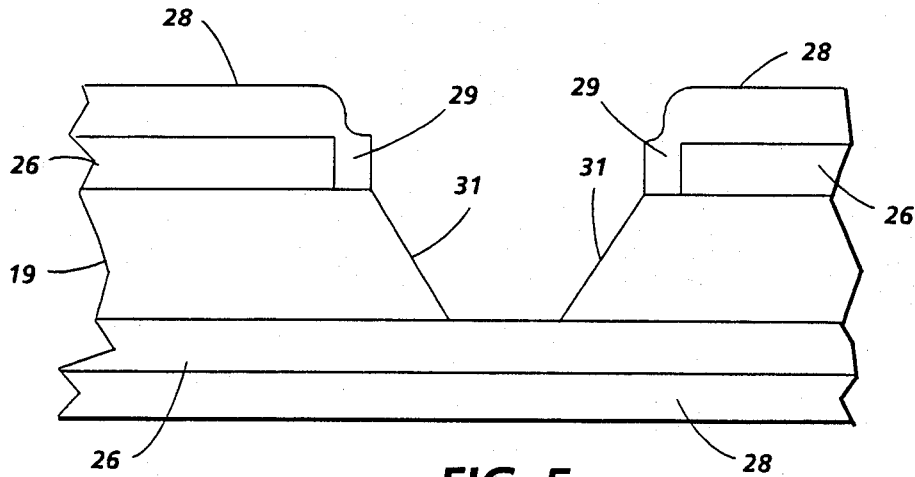
FIG. 5 is an enlarged, cross-sectional view of the wafer of FIG. 3, as viewed along view line 5—5.

In FIGS. 3 through 5, a (100) silicon wafer 19 is partially shown with a thermally grown oxide layer (SiO$_2$) 26 on both sides which is about 5000Å thick. It is lithographically processed to form a via 23 therein shown in dashed line. This via enables the production of the ink channels and connected reservoir. Although the via shows only three parallel extensions 25 which represent the future ink channels, there are 300 to 600 per inch in an actual printhead. The small number of extensions shown is for ease of explanation, it being understood that the same principle applies for an actual printhead. A silicon nitride (Si$_3$N$_4$) layer 28 is then deposited over the patterned SiO$_2$ layer and exposed silicon wafer surface 22. The thickness of the Si$_3$N$_4$ layer is sufficient to assure adequate robustness to prevent handling damage during subsequent processing steps. The Si$_3$N$_4$ layer 28 is then lithographically processed to produce via 24, so that via 24 exposes the bare silicon surface 22 of wafer 19. Note that a border 29 of Si$_3$N$_4$ (see FIG. 5) is left about 1 mil wide inside of the SiO$_2$ via 23 both for protection and limitation of undercutting during subsequent ODE processing. When the wafer is anisotropically etched, the silicon is etched through where exposed by via 24 to form reservoir recesses 30.

FIG. 4 is a cross sectional view of FIG. 3 as viewed along view line 4—4 thereof and after a first anisotropic etching, so that the reservoir recess 30 is shown together with via 23 along the length of the extension 25.

FIG. 5 is a cross sectional view of FIG. 3 as viewed along view line 5—5 thereof and after a first anisotropic etching to form reservoir recesses 30. The wall 31 of the anisotropically etched reservoir recess 30 lie in the {111} crystal plane of the wafer. A border 29 of Si$_3$N$_4$ prevents undercutting of the closer tolerance etch mask or via 23 during the coarser etching of the reservoir recesses 30.

Figure 6:
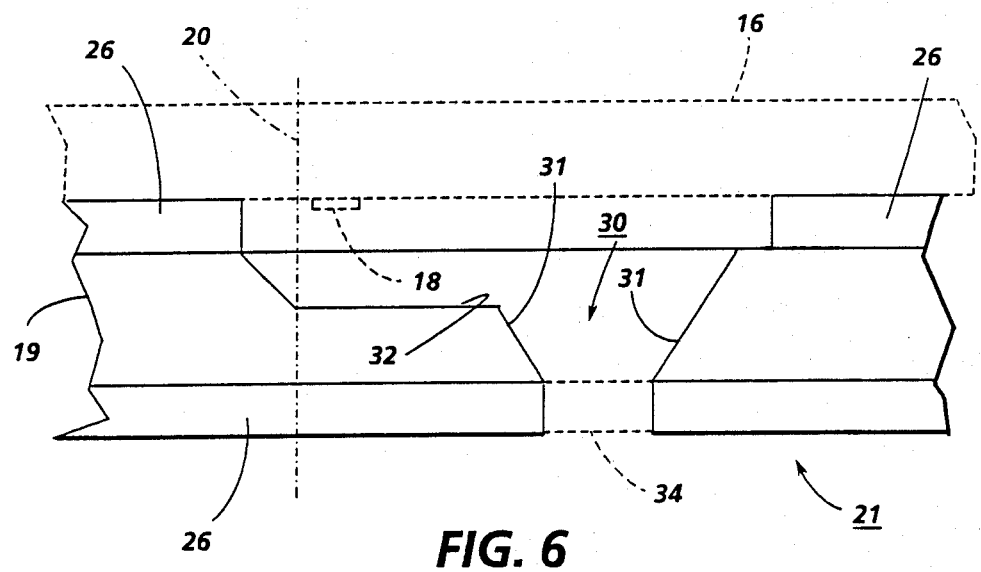
FIG. 6 is similar to FIG. 4, but after the second etching process and with the heater plate added in dashed line.

Referring to FIG. 6, the Si$_3$N$_4$ layer 28 is stripped and the wafer cleaned, and it is ODE processed again using the SiO$_2$ layer 26 as a mask to etch the channel recesses 32. Concurrently with the channel etching, the border 29 is etched enlarging the reservoir slightly, while maintaining its {111} crystal plane walls 31.

Figure 7:
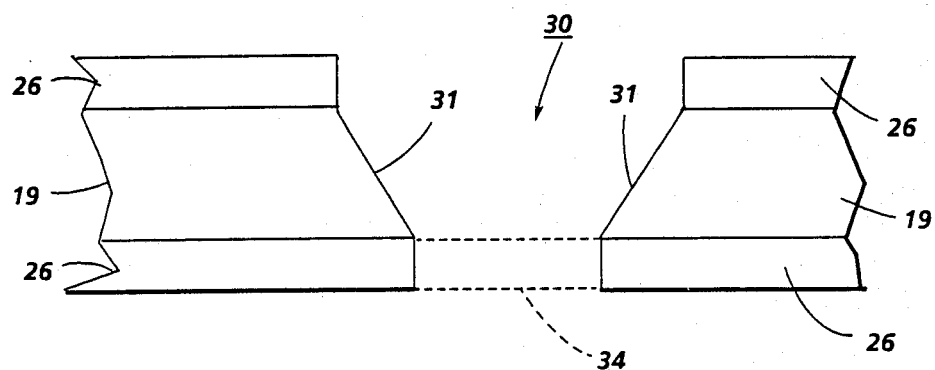
FIG. 7 is similar to FIG. 5, but after the second etching process.

FIG. 6 is a view similar to that of FIG. 5 showing the cross sectional view of the wafer 19 after the channel recesses 32 have been etched and the reservoir enlarged. Heater plate 16 has been added in dashed line for ready comparison with the prior art channel plate of FIG. 2. Note that the channel recesses 32 are already connected to the reservoir recess 30. FIG. 7 is a view similar to that of FIG. 5, but also after the second etching process.

Before the channel plate wafer 19 and heater plate wafer 16 are aligned, bonded and diced, the SiO$_2$ layer 26 is totally removed or removed only from the bottom 34 of the reservoir 30 to permit ink access thereto, as shown in dashed line in FIGS. 6 and 7.

Figure 8:
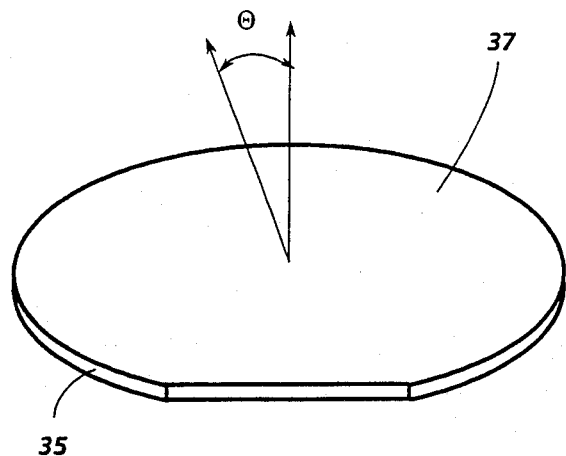
FIG. 8 is a schematic isometric representation of a silicon wafer showing intentional misorientation of a (100) wafer.
Figure 9:
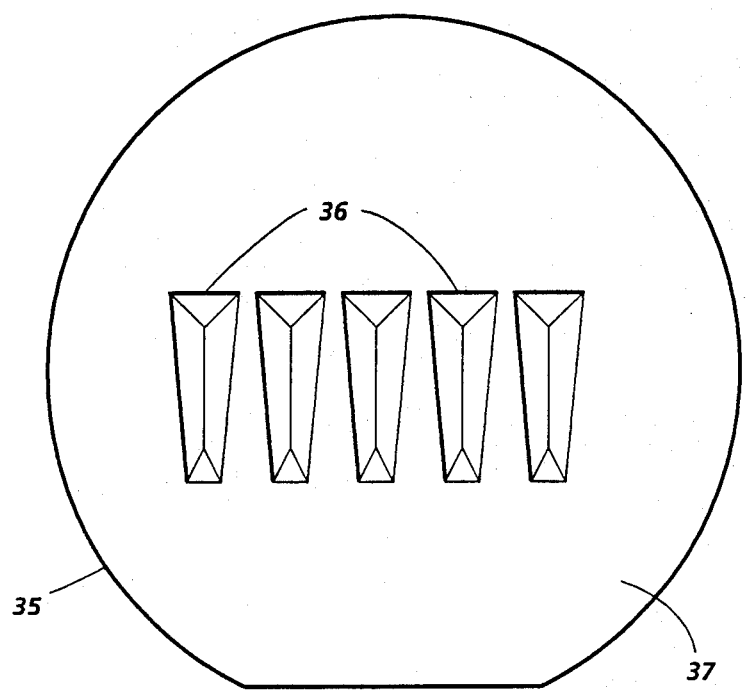
FIG. 9 is a schematic plan view of a silicon wafer wherein intentional misorientation of (100) wafer creates trapezoidal recesses when anisotropically etched.

The main thrust of this invention is to apply a two step etch process on (100) oriented wafers and produce small rectangular or square features with precise dimensional control on the same substrate with large features that are typically etched most or all the way through a wafer. An additional feature of this invention allows formation of trapezoidal shaped recesses 36 in a silicon wafer 35, as shown in FIG. 9. If the surface 37 of the silicon wafer 35 in FIG. 8 is intentionally misoriented to a precise number of degrees off (100) plane in the (110) plane direction, as shown by angle Θ in FIG. 8, trapezoidal shapes 36 can be constructed by the same two step etch process. FIG. 8 shows the configuration for intentional misalignment of the wafer, and FIG. 9 shows the resultant shapes created.

In summary, this invention relates to the batch fabrication of three dimensional silicon structures by a single side, multi-step ODE processing technique. All masks are formed one on top of the other prior to etching, with the coarsest mask used first and the highest tolerance or finest mask used last. Once the coarse anisotropic etching is completed, the coarse mask is removed and the fine anisotropic etching is done. Because anisotropy can be adjusted for fast or slow etch rates, the fabrication of structures having both large deep recesses or large through holes and shallow high tolerance recesses can be done much faster and the mask undercutting greatly reduced. An obvious extension of this concept is to add more than two etch steps to the process.

A good example of a three dimensional silicon structure is a channel plate for a thermal ink jet printhead of the type described in U.S. Pat. No. Re. 35,572 to Hawkins et al, which patent is hereby incorporated by reference. The difference in a printhead fabricated by the Reissue patent to Hawkins et al and this invention is that the channel plate is produced by the single side, multi-step ODE etching process described above.

Although the foregoing description illustrates the preferred embodiment as a thermal ink jet channel plate, other variations and other three dimensional silicon structures are possible. All such variations and other structures as will be obvious to one skilled in the art are intended to be included within the scope of this invention as defined by the following claims.

I claim:

1. A method for fabricating a three dimensional structure from a silicon wafer whose surface is specifically oriented with respect to the (100) and (110) crystal planes of the wafer comprising the steps of:
   (a) forming a first layer of etch resistant material on both side surfaces of the wafer;
   (b) patterning the first layer of etch resistant material on one of the wafer surfaces to produce a plurality of precisely located vias therein for subsequent orientation dependent etching (ODE) of recesses, so that said recesses will be bounded by walls lying along the {111}planes of the wafer;
   (c) depositing a second layer of etch resistant material on both sides of the wafer and over the first layer of etch resistant material, including the via therein;
   (d) patterning the second layer of etch resistant material on the same side as patterned on the first layer of etch resistant material to produce at least one via within the boundary of one or each of the vias in said first layer of etch resistant material for production of relatively deep recesses in the wafer by ODE;
   (e) placing the wafer into an anisotropic etchant medium to produce relatively deep coarse recesses in the wafer through the vias in the second layer of etch resistant material;
   (f) removing the second layer of etch resistant material; and
   (g) replacing the wafer into the anisotropic etchant medium to produce relatively shallow, fine recesses in the wafer through the vias in the first layer of etch resistant material.

2. The method of claim 1, wherein the wafer surface is (100).

3. The method of claim 1, wherein the wafer surface is at a precise angle with respect to (100) plane and toward (110) plane, so that anisotropic etching produces trapezoidal shaped recesses in the wafer.

4. The method of claim 1, wherein one or more additional etch resistance layers are added and patterned prior to step (e) with the coarsest patterned etch resistance material formed last to create a multi-layer sequential etching structure.

5. The method of claim 1, wherein the first layer of etch resistant material is a thermally grown oxide ($SiO_2$) having a thickness of about 5000Å, and wherein the second layer of etch resistant material is silicon nitride ($Si_3N_4$) having a thickness sufficient to provide the desired robustness to the wafer.

6. The method of claim 5, wherein the three dimensional structure is a plurality of channel plates for assembly with a plurality of heater plates to produce a quantity of ink jet printheads, and wherein said vias in the silicon nitride is positioned within each of the vias in the thermal oxide, so that a predetermined border exists between the edges of the via in the silicon nitride and the edges of the vias in the thermal oxide.

7. The method of claim 6, wherein the vias in the thermal oxide each have a predetermined number of parallel extensions which will enable the production of ink channel recesses connected directly to an associated reservoir recess without the need for a separate process step.

* * * * *

UNITED STATES PATENT AND TRADEMARK OFFICE
CERTIFICATE OF CORRECTION

PATENT NO. : 4,863,560
DATED : September 5, 1989
INVENTOR(S) : William G. Hawkins It is certified that error appears in the above--identified patent and that said Letters Patent is hereby corrected as shown below:

Title Page, after "Inventor", add:

--[73] Assignee: Xerox Corporation, Stamford, CT--

Title Page, after "Attorney, Agent, or Firm", cancel "Victor F. Volk" and insert -- Robert A. Chittum--

Signed and Sealed this

Twenty-third Day of October, 1990

*Attest:*

HARRY F. MANBECK, JR.

*Attesting Officer*  *Commissioner of Patents and Trademarks*